(12) United States Patent
Sciancalepore et al.

(10) Patent No.: US 11,231,550 B2
(45) Date of Patent: Jan. 25, 2022

(54) WAVEGUIDE MANUFACTURING PROCESS

(71) Applicant: COMMISSARIAT A L'ENERGIE ATOMIQUE ET AUX ENERGIES ALTERNATIVES, Paris (FR)

(72) Inventors: Corrado Sciancalepore, Grenoble (FR); Houssein El Dirani, Grenoble (FR); Jean-Michel Hartmann, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/126,938

(22) Filed: Dec. 18, 2020

(65) Prior Publication Data
US 2021/0223474 A1    Jul. 22, 2021

(30) Foreign Application Priority Data
Dec. 20, 2019    (FR) ...................................... 19 15344

(51) Int. Cl.
*G02B 6/13*    (2006.01)
*G02B 6/132*    (2006.01)
(Continued)

(52) U.S. Cl.
CPC ............. *G02B 6/131* (2013.01); *G02B 6/132* (2013.01); *G02B 6/136* (2013.01);
(Continued)

(58) Field of Classification Search
None
See application file for complete search history.

(56) References Cited

U.S. PATENT DOCUMENTS

| | | | | |
|---|---|---|---|---|
| 2002/0031321 A1* | 3/2002 | Lee | .................... | G02B 6/122 385/129 |
| 2002/0104822 A1* | 8/2002 | Naydenkov | ............ | G02B 6/122 216/24 |

(Continued)

FOREIGN PATENT DOCUMENTS

| | | | |
|---|---|---|---|
| CN | 107132617 A | * | 9/2017 |
| FR | 2840415 A1 | * | 12/2003 |

(Continued)

OTHER PUBLICATIONS

European Search Report dated May 20, 2021 in European Patent Application No. 20215584.2 (with English translation of categories of cited documents), 10 pages.

(Continued)

*Primary Examiner* — Michael Stahl
(74) *Attorney, Agent, or Firm* — Oblon, McClelland, Maier & Neustadt, L.L.P.

(57) ABSTRACT

The invention relates to a method for manufacturing a waveguide (2a, 2b) comprising:
  A supplying of a substrate (1) comprising a stack of a first layer (11) based on a first material on a second layer (12) based on a second material, and
  at least one sequence successively comprising:
    An etching of the first material, in such a way as to define at least one pattern (20, 22a) having etching flanks (200, 201),
    A smoothing annealing assisted by hydrogen in such a way as to smooth the etching flanks (200, 201) of the at least one pattern (20, 22a),
    A re-epitaxy of the first material on the pattern (20, 22a) based on the first material.

15 Claims, 3 Drawing Sheets

(51) Int. Cl.
  *G02B 6/136* (2006.01)
  *G02B 6/12* (2006.01)
  *H01L 21/324* (2006.01)

(52) U.S. Cl.
  CPC .......... *G02B 2006/1218* (2013.01); *G02B 2006/12035* (2013.01); *G02B 2006/12169* (2013.01); *G02B 2006/12178* (2013.01); *H01L 21/3247* (2013.01)

(56) References Cited

U.S. PATENT DOCUMENTS

| 2002/0176679 | A1  | 11/2002 | Nashimoto |              |
|--------------|-----|---------|-----------|--------------|
| 2005/0013575 | A1* | 1/2005  | Sparacin  | G02B 6/136   |
|              |     |         |           | 385/129      |
| 2005/0158002 | A1* | 7/2005  | Kubby     | G02B 6/136   |
|              |     |         |           | 385/129      |
| 2008/0253728 | A1* | 10/2008 | Sparacin  | G02B 6/122   |
|              |     |         |           | 385/132      |
| 2016/0197111 | A1* | 7/2016  | Coolbaugh | H01L 27/14625|
|              |     |         |           | 257/432      |
| 2019/0177836 | A1* | 6/2019  | Hartmann  | G02B 6/102   |
| 2021/0033791 | A1* | 2/2021  | Chern     | G02B 6/136   |

FOREIGN PATENT DOCUMENTS

| FR | 2 845 775 A1     | 4/2004  |
| WO | WO 2011/127840 A1 | 10/2011 |

OTHER PUBLICATIONS

French Preliminary Search Report dated Aug. 24, 2020 in French Application 19 15344 filed Dec. 20, 2019 (with English Translation of Categories of Cited Documents and Written Opinion), 11 pages.

Bellegarde, C. et al., "Improvement of Sidewall Roughness of Submicron SOI Waveguides by Hydrogen Plasma and Annealing," 2018 IEEE Photonics Conference (IPC), Sep. 30, 2018, XP033442228, 4 pages.

\* cited by examiner

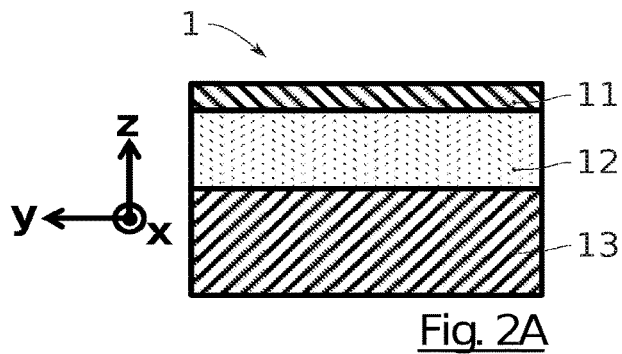
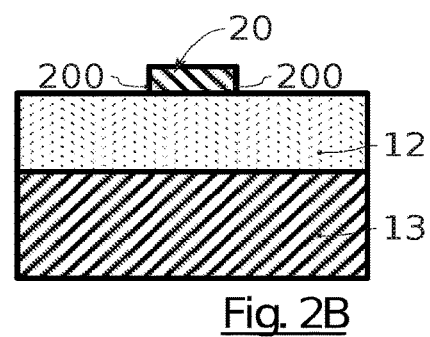
Fig. 2A         Fig. 2B
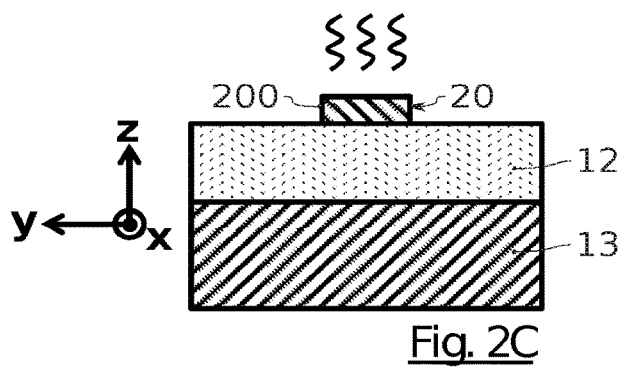
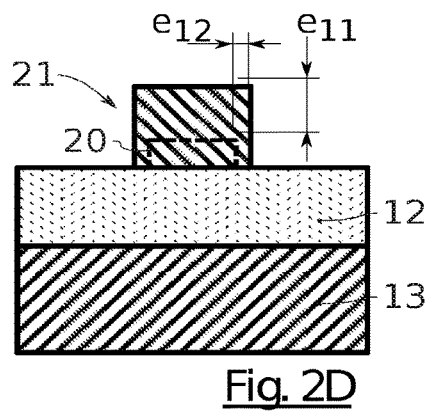
Fig. 2C         Fig. 2D
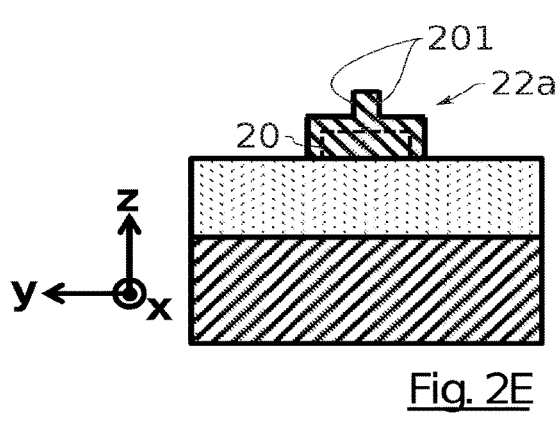
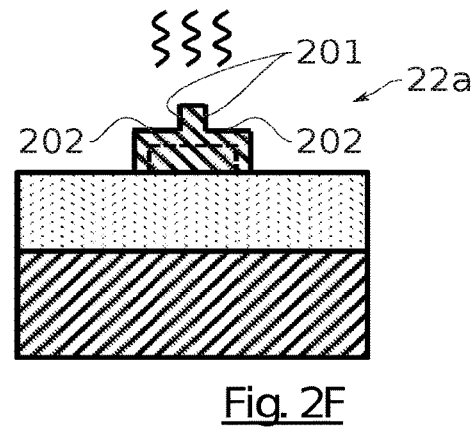
Fig. 2E         Fig. 2F

WAVEGUIDE MANUFACTURING PROCESS

TECHNICAL FIELD

The present invention relates to the field of optoelectronics. It has for particularly advantageous application the carrying out of waveguides that have very little optical losses by propagation.

PRIOR ART

In the field of silicon integrated optics, waveguides are essential components. They form an optical circuitry that makes it possible to interconnect different optoelectronic components. Sub-micrometric waveguides are in particular used in applications linked to optical telecommunications, photonics, non-linear optics and quantum computing.

Waveguides generally comprise a core wherein light propagates and a clad that makes it possible to confine the light in the core, in contrast to refractive index. In order to improve the performance of sub-micrometric waveguides, it is important to reduce the optical losses caused during the propagation of the light within these waveguides.

The optical losses are due to several physical phenomena. There are for example absorption losses, either directly within the solid material of the core, at the crystalline defects or impurities for example, or on the surface of this material, at the surface states between the core and the clad of the waveguide for example. There are also losses due to non-linear effects, involving for example a two-photon absorption or by free carriers. There are also diffusion losses that occur mainly at the flanks of the waveguide. These diffusion losses are in particular linked to the roughness of the flanks. The Payne-Lacey equation hereinbelow establishes the relationship between the losses a and the roughness R of the flanks:

$$\alpha = \varphi^2(d)(n_1^2 - n_2^2)^2 \frac{k_0^3}{4\pi n_1} \int_0^\pi R(\beta - n_2 k_0 \cos\theta) d\theta$$

Where φ is the amplitude of the electrical field of the optical mode at the flanks of the guide, d is the width of the guide, n_1, n_2 are respectively the refractive indexes of the core and of the clad of the guide, β is the propagation constant of the optical mode, θ is a propagation angle of the optical mode with respect to the axis of the guide.

It appears that, during the propagation, a non-negligible portion of the optical mode spatially covers the flanks of the guide. The roughness of the flanks then induces a phenomenon of diffusion, which is at the origin of optical losses.

The improvement in the methods of manufacturing these waveguides has made it possible to substantially reduce the propagation losses of the light in a conventional optical circuitry based on silicon. In particular, the improvement in the methods of lithography and of etching today makes it possible to manufacture waveguides that have optical propagation losses of about from 2 to 3 dB/cm. Additional methods make it possible to further reduce these optical losses.

Document "C. Bellegarde, et al. "Improvement of sidewall roughness of submicron SOI waveguides by hydrogen plasma and annealing," IEEE Photonics Technology Letters, 30(7), pp. 591-594, April 2018" presents for example a method for manufacturing a single-mode waveguide 300 nm thick and 450 nm wide that has optical losses of 0.5 dB/cm at the wavelength of 1.55 μm. This method of manufacturing in particular comprises, after etching of the waveguide pattern, a step of smoothing etching flanks via an annealing under hydrogen. This makes it possible to reduce the roughness of the etching flanks. The optical diffusion losses at the flanks are thus reduced.

There is still a need consisting of reducing all the sources of optical losses of the waveguide, and in particular optical losses by diffusion and/or by absorption.

An object of the present invention is to propose a method for manufacturing a waveguide that makes it possible to reduce the optical losses.

The other objects, characteristics and advantages of the present invention shall appear when examining the following description and the accompanying drawings. It is understood that other advantages can be incorporated.

SUMMARY

To reach this objective, an aspect of the invention relates to a method for manufacturing a waveguide comprising:

A supplying of a substrate comprising a stack of a first layer based on a first material on a second layer based on a second material, and at least one sequence successively comprising:

An etching of the first material over an entire thickness of the first layer, in such a way as to define at least one pattern having etching flanks, A smoothing annealing assisted by hydrogen in such a way as to smooth the etching flanks of the at least one pattern, An epitaxy of the first material on the pattern based on the first material.

The first material is typically different from the second material. The epitaxy of the first material on the pattern the etching flanks of which are smoothed beforehand advantageously makes it possible to further reduce the roughness of the flanks. The optical diffusion losses in such a waveguide are thus reduced.

The sequence comprising an etching of a pattern, a smoothing of the etching flanks of this pattern, then an epitaxy on this pattern can be repeated several times, entirely or partially. The etching depth and the thickness of the epitaxial material can be adjusted according to the configuration of the waveguide desired.

The method according to the invention thus makes it possible to manufacture different types of waveguides, for example a strip waveguide or an edge waveguide, while still minimising the roughness of the flanks of the waveguide. The method according to the invention makes it possible to manufacture waveguides that have very low optical losses by diffusion.

The epitaxy of the first material also makes it possible to limit and even suppress the impurities within this first material, which typically forms the core of the waveguide. The absorption losses of the waveguide manufactured by the method according to the invention are reduced.

BRIEF DESCRIPTION OF THE FIGURES

The purposes and objects as well as the characteristics and advantages of the invention shall appear better in the detailed description of embodiments of the latter which are shown in the following accompanying drawings wherein:

FIGS. 2A to 2I respectively show as a cross-section steps of a method for manufacturing a waveguide according to another embodiment of the present invention.

Figure 1A:
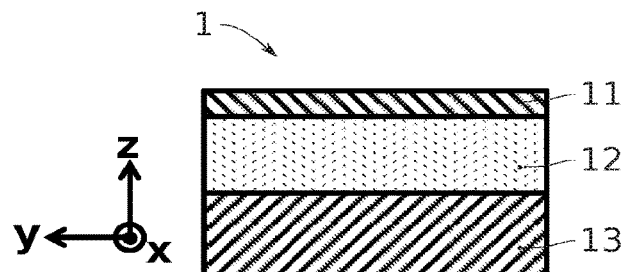
FIGS. 1A to 1F respectively show as a cross-section steps of a method for manufacturing a waveguide according to an embodiment of the present invention.

The drawings are given as examples and do not limit the invention. They form block diagram representations intended to facilitate the understanding of the invention and are not necessarily to the scale of the practical applications. In particular, the relative dimensions of the various layers and patterns of the waveguide are not representative of reality.

DETAILED DESCRIPTION

Before beginning a detailed review of embodiments of the invention, optional characteristics that can possibly be used combined or alternatively are mentioned hereinafter:

Before beginning a detailed review of embodiments of the invention, it is reminded that the invention comprises in particular the optional characteristics hereinafter that can be used combined or alternatively:

According to an example, the first layer has a thickness less than or equal to 10 nm.

According to an example, the method comprises at least one sequence wherein the first material is etched according to an etching depth less than 10 nm.

According to an example, the method comprises at least one sequence wherein the first epitaxial material has an epitaxial thickness greater than 50 nm.

According to an example, the epitaxial thickness is at least five times, and preferably at least ten times, greater than the thickness of the first layer.

According to an example, the epitaxy is configured in such a way that the first epitaxial material has an epitaxial thickness greater than 100 nm.

According to an example, the method comprises at least one additional epitaxy of the first material over an epitaxial thickness less than 5 nm.

According to an example, the method comprises a first sequence comprising:
- a first etching of the first material over the entire thickness of the first layer in such a way as to define a first pattern,
- a first smoothing of the etching flanks of said first pattern, and
- a first epitaxy of the first material on this first pattern, over an epitaxial thickness e11 greater than 100 nm, said first sequence making it possible to form a first portion of the waveguide.

According to an example, the method further comprises, after the first sequence, a second sequence comprising:
- a second etching of the first portion of the waveguide in such a way as to define a second pattern,
- preferably, a second smoothing of the etching flanks of said second pattern, and
- preferably, a second epitaxy of the first material on this second pattern (22a), over an epitaxial thickness e21, e22 less than 5 nm, said second sequence making it possible to form a second portion of the waveguide, in such a way as to obtain for example an edge waveguide.

According to an example, the epitaxy of the first material is done over all of the exposed faces of the pattern, in particular on the flanks and an apex of the pattern.

According to an example, the method further comprises, after the at least one sequence, a formation of a third layer based on a third material on the first material, said third material having a refractive index less than that of the first material and/or greater than that of the second material.

Typically, the third material is different from the first material, and preferably also from the second material. According to an example, the third material is a nitride based on the first material.

According to an example, the third layer has a thickness comprised between 10 nm and 50 nm, preferably between 20 nm and 30 nm.

According to an example, said formation of the third layer comprises a conformal deposition of the third material.

According to an example, the conformal deposition of the third material comprises a low pressure chemical vapor deposition (LPCVD).

According to an example, said formation of the third layer comprises a diffusion of species in the first material from a controlled atmosphere.

According to an example, the third material is a nitride based on the first material and the diffusion of species in the first material is a diffusion of nitrogen from a controlled atmosphere having a concentration in nitrogen greater than 80% and preferably equal to 100%.

According to an example, the diffusion of nitrogen is done at a temperature greater than or equal to 1200° C.

According to an example, the method further comprises an encapsulation by an encapsulation layer based on the second material, on the first material or on the third material.

According to an example, the first material is silicon, the second material is silicon oxide.

The waveguide manufactured by the method according to the invention can have, as a cross-section, different shapes. In what follows, two embodiments that make it possible to manufacture respectively a strip waveguide and an edge waveguide are described. This does not limit the invention. Other waveguide geometries, for example with a slot or periodic network, are obviously possible.

In the accompanying drawings, only one section of the waveguide in a plane yz is shown. This section is not necessarily constant along x, along the waveguide. The waveguide typically extends continuously along a longitudinal direction x. It then guides the propagation of the light radiation along x.

Where applicable, the term "re-epitaxy" means a resuming of epitaxy. This resuming of epitaxy is preferably an epitaxy of the first material on the first material, or an epitaxy of a material based on the first material on the first material. The term "smoothing" means a decrease in the roughness, for example the average roughness.

It is stated that, in the framework of the present invention, a third layer inserted between a first layer and a second layer does not necessarily mean that the layers are directly in contact with one another, but means that the third layer is either directly in contact with the first and second layers, or is separated from the latter by at least one other layer or at least one other element, unless it is arranged otherwise.

The terms substrate, a film, a layer, "based on" a material M, mean a substrate, a film, a layer comprising this material M alone or this material M and possibly other materials, for example alloy elements, impurities or doping elements. Where applicable, the material M can have different stoichiometries. Thus, a layer made from a material based on silicon nitride can for example be a layer of SiN or a layer of $Si_3N_4$ (generally called stoichiometric silicon nitride).

In what follows, the length is taken along the direction x, the width is taken along the direction y, and the height and the etching depth are taken along the direction z. The thickness of a layer is taken along a direction normal to the main plane of extent of the layer.

In what follows, a refractive index is defined for a material, possibly for an average material, and for a wavelength.

The terms "substantially", "about", "of about" mean "within 10%" or, when it entails an angular orientation, "within 10°". Thus, a direction substantially normal to a plane means a direction that has an angle of 90±10° with respect to the plane.

The invention shall now be described in detail through a few non-limiting embodiments.

A first embodiment of the method is shown in FIGS. 1A to 1F. This first embodiment makes it possible in particular to manufacture a strip waveguide.

A substrate 1 is first supplied (FIG. 1A). This substrate 1 is preferably of the SOI type (for Silicon On Insulator). It can typically comprise a first layer 11 of silicon, referred to as topSi, a second layer 12 of buried oxide silicon referred to as BOX, and a solid layer 13, referred to as bulk, made of silicon. The substrate 1 can alternatively be of the GeOI type (for Germanium On Insulator) with a first layer 11 made from germanium. The thickness of the first layer 11 is in this example about 5 nm to 10 nm. More generally, the thickness of the first layer 11 can be comprised between 5 nm and 350 nm. This first layer 11 is intended to form at least partially the core of the waveguide. The second layer 12 is intended to form at least partially the clad of the waveguide.

Figure 1B:
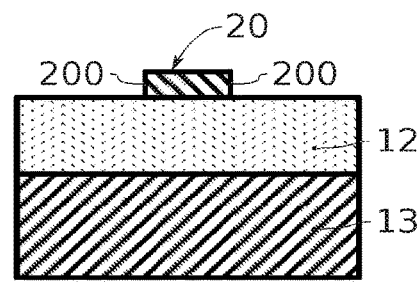

An etching of the first layer 11 is then carried out (FIG. 1B). This etching is typically a dry etching. It can be carried out via plasma, for example within a reactor generating inductively coupled plasma (ICP). The etching of the topSi can be done from a plasma having chemistry based on HBr, for example a Br/Cl2/He—O2 chemistry. The etching depth corresponds in this example to the thickness of the topSi.

To carry out the etching of the topSi, a lithography mask is preferably used. This mask can comprise an anti-reflective layer and a layer of photosensitive resin structured in the form of lithography patterns. Such a stack of layers is for example described in sections II.A and II.B of the document "C. Bellegarde, et al. "Improvement of sidewall roughness of submicron SOI waveguides by hydrogen plasma and annealing," *IEEE Photonics Technology Letters*, 30(7), pp. 591-594, April 2018". Optionally and such as indicated in this document also, a first step of smoothing can be implemented at the end of the lithography and before the etching of the topSi. This first step of smoothing makes it possible in particular to smooth the flanks of the lithography patters in photosensitive resin, before transfer of said patterns in the topSi. This first step of smoothing can be carried out by hydrogen plasma.

The etching of the topSi makes it possible to form a pattern 20 from which the waveguide is then carried out. This pattern 20 has in this example a height of about from 5 nm to 10 nm. It has etching flanks 200 obtained at the end of the etching.

Figure 1C:
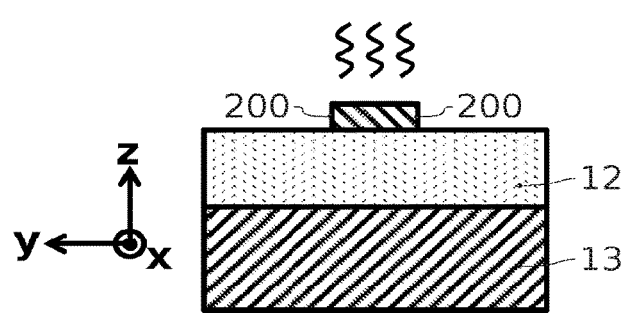

FIG. 1C shows a second step of smoothing, configured to smooth the etching flanks 200 of the pattern 20. This second step of smoothing is typically carried out by annealing under hydrogen H2. The annealing temperature is less than the melting temperature of the material of the pattern 20. The annealing temperature is here less than 1414° C. for a pattern 20 made of Si. It can be for example 850° C., for an annealing under hydrogen of about 2 min.

Figure 1D:
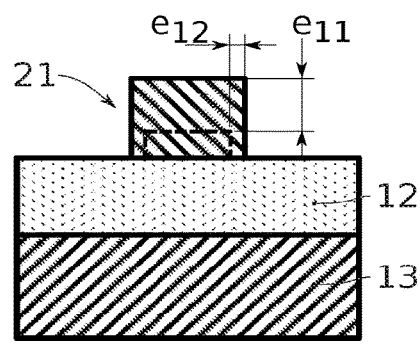

After smoothing of the etching flanks 200, an epitaxy of silicon is carried out on the pattern 20 (FIG. 1D). This epitaxy makes it possible to further reduce the roughness of the flanks, with respect to etched flanks. The epitaxy of the silicon can be done according to different thicknesses $e11$, $e12$. In this example, the pattern 20 is similar to a thin seed from which a thick portion 21 is formed. The epitaxial thickness $e11$ along z is here about 200 nm. This makes it possible to obtain a total height of about 220 nm for the portion 21 of waveguide. This portion 21 typically corresponds to the core of the waveguide. The epitaxial thickness $e12$ along y, on the smoothed etching flanks, can be less than or equal to the thickness $e11$. According to this embodiment, the epitaxy is carried out on all the exposed faces of the pattern 20, i.e. on the apex and on the flanks 200 of the pattern 20. A strip waveguide core can also be carried out.

The topSi typically has a residual level of doping. The epitaxy of silicon is advantageously carried out without adding dopants. The epitaxial silicon of the portion 21 therefore does not have any residual doping. A thick epitaxy of silicon, for example over an epitaxial thickness of about 200 nm, on the thin seed coming from the topSi advantageously makes it possible to form a portion 21 that is mostly devoid of residual doping. This results in that the losses by absorption in this portion 21 are advantageously minimised.

The height of the seed is therefore preferably as low as possible, typically less than 10 nm. The width of the seed is therefore preferably as low as possible, typically less than 50 nm, even 20 nm. According to a preferred possibility, the epitaxy thicknesses $e11$, $e12$ are substantially equal to one another.

Optionally, an additional smoothing and/or an additional epitaxy of silicon, over an epitaxial thickness less than 5 nm can be carried out on the portion 21.

Figure 1E:
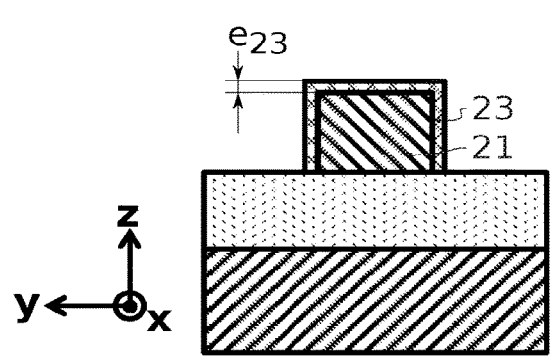

Optionally, a layer 23 of silicon nitride (SiN) of thickness $e23$ is then formed on the portion 21 (FIG. 1E). The thickness $e23$ of this layer 23 is typically about 20 nm to 30 nm. Silicon nitride (SiN) has a refractive index of 1.983 for a wavelength of 1.55 μm. Silicon (Si) has a refractive index of 3.47 for a wavelength of 1.55 μm. Silicon dioxide (SiO2), which is typically used to form the clad of the waveguide, has a refractive index of 1.446 for a wavelength of 1.55 μm. The refractive index of the SiN is therefore comprised between the refractive indexes of Si and of SiO2. This makes it possible to reduce the diffusion losses according to the Payne-Lacey equation mentioned hereinabove. This makes it possible to limit the optical losses at the surface of the core, between the core and the clad of the waveguide.

The layer 23 of silicon nitride (SiN) can be formed by conformal deposition, for example by low pressure chemical vapor deposition LPCVD at a temperature of about 780° C. Alternatively, the layer 23 of silicon nitride (SiN) can be formed directly by nitriding a part of the portion 21 (FIG. 1E). Such nitriding can be carried out under controlled atmosphere with a concentration in nitrogen (N) of 100%, at a temperature of about 1200° C.

Figure 1F:
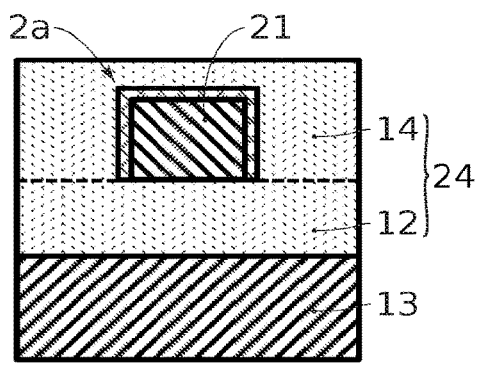

Preferably, an encapsulation of the core is then carried out by an encapsulation layer 14 (FIG. 1F). This encapsulation layer 14 is preferably made of SiO2. It can be deposited via CVD. It makes it possible to form another portion of the clad of the waveguide. The clad 24 is thus formed all around the core by the layers 12 and 14 made of SiO2. This first embodiment makes it possible to form a strip waveguide 2a.

In order to form a strip waveguide 2a that is single-mode at the wavelengths used in telecommunications (for example about 1.55 μm), the core 21 can have a height along z comprised between 0.2 μm and 0.4 μm, and a width along y comprised between 0.2 μm and 0.4 μm. The lower portion of the clad 24 formed by the layer 12 preferably has a height greater than or equal to 0.7 μm in a single-mode waveguide 2a configuration.

Other embodiments of the method according to the present invention can be considered. These embodiments can typically combine several sequences of steps each comprising an etching of the silicon followed by a smoothing of the etching flanks and an epitaxy of silicon. Different etching depths and different epitaxial thicknesses can make it possible to form different waveguide geometries.

Figure 2G:
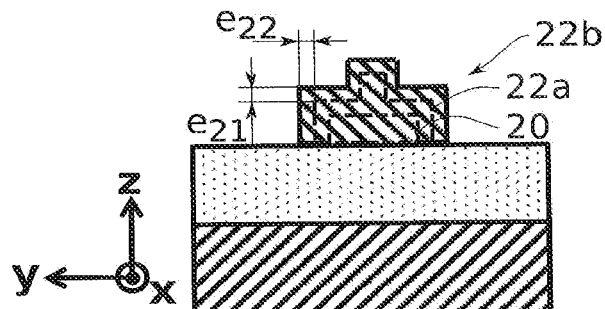

According to a second embodiment shown in FIGS. 2A to 2I, the method makes it possible to form an edge waveguide. Only the steps different from the first embodiment are described hereinafter, the other steps are deemed to be identical. From a substrate of the SOI type (FIG. 2A), an etching of the topSi is carried out as hereinabove, in such a way as to obtain a pattern 20 (FIG. 2B). A smoothing (FIG. 2C) then a first re-epitaxy (FIG. 2D) are carried out on the pattern 20, in such a way as to form a first portion 21 of the waveguide.

A second etching is then carried out at the first portion 21, in such a way as to form a second pattern 22a having etching flanks 201. This second pattern 22a can typically have an inverted T cross-section, such as shown in FIG. 2E. This makes it possible to manufacture in fine a waveguide that has a so-called "edge" geometry. The depth of the second etching here corresponds to the height of the edge, i.e. the portion protruding from the second pattern 22a.

A second step of smoothing etching flanks 201 is then carried out (FIG. 2F). This second step of smoothing is typically similar to the step of smoothing of the etching flanks mentioned hereinabove. It makes it possible to reduce the roughness of the flanks 201 and of the surfaces 202.

A second epitaxy of silicon is then carried out on the second pattern 22a, in such a way as to form a second portion 22b of the waveguide (FIG. 2G). This second portion 22b typically corresponds to the core of the edge waveguide.

The second epitaxy of the silicon can be done according to different thicknesses e21, e22. In this example, the epitaxial thickness e21 along z is about from 2 nm to 3 nm. The epitaxial thickness e22 along y is substantially equal to the thickness e21. According to this embodiment, the second epitaxy is carried out on all of the exposed faces of the second pattern 22a. According to a possibility, the epitaxial thicknesses e21, e22 are greater than 5 nm, even greater than 50 nm.

Figure 2H:
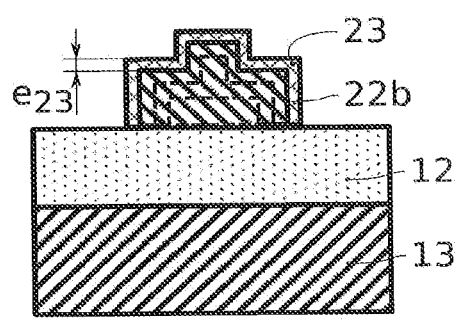
Figure 2I:
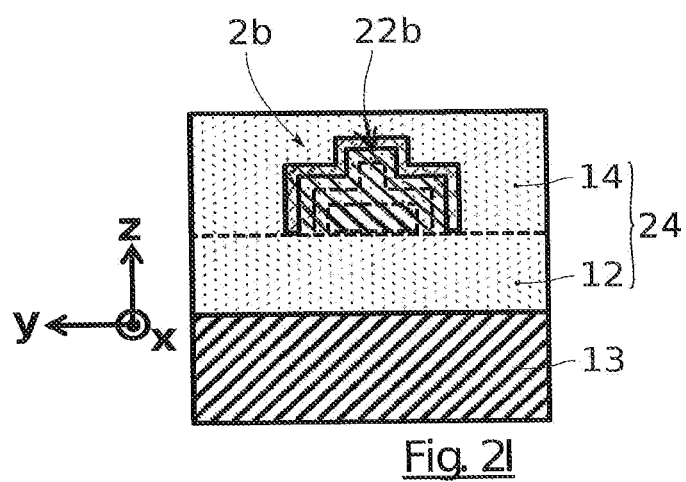

In a manner similar to the first embodiment, a layer 23 of silicon nitride (SiN) can be formed on the core 22b of the waveguide (FIG. 2H). Preferably, an encapsulation of the core is then carried out by an encapsulation layer 14 (FIG. 2I).

This second embodiment makes it possible to form an edge waveguide 2b.

The waveguides manufactured by the method according to the present invention can advantageously be used for LiDAR and 400G long-distance telecom applications, and for quantum photonics and frequency comb applications.

The invention is not limited to the embodiments described hereinabove and extends to all the embodiments covered by the claims.

In particular, several steps of etching and/or smoothing and/or epitaxy can be implemented to form the waveguide. In this case, the etching depths and/or the epitaxial thicknesses can vary from one step to another.

The invention claimed is:

1. A method for manufacturing a waveguide comprising:
a supplying of a substrate comprising a stack of a first layer based on a first material on a second layer based on a second material, and
at least one sequence successively comprising:
   i. an etching of the first material over an entire thickness of the first layer, in such a way as to define at least one pattern having etching flanks,
   ii. a smoothing annealing assisted by hydrogen in such a way as to smooth the etching flanks of the at least one pattern,
   iii. in epitaxy of the first material on the pattern based on the first material, said epitaxy being carried out on the flanks and an apex of the pattern.

2. The method according to claim 1, wherein the first layer has a thickness less than or equal to 10 nm.

3. The method according to claim 1, wherein the epitaxy is configured in such a way that the first epitaxial material has an epitaxial thickness greater than 100 nm.

4. The method according to claim 1, comprising at least one additional epitaxy of the first material over an epitaxial thickness less than 5 nm.

5. The method according to claim 1, wherein the first layer has a thickness less than or equal to 10 nm, said method comprising a first sequence comprising:
a first etching of the first material over the entire thickness of the first layer in such a way as to define a first pattern,
a first smoothing of etching flanks of said first pattern, and
a first epitaxy of the first material on this first pattern, over an epitaxial thickness greater than 100 nm, said first sequence making it possible to form a first portion of the waveguide,
the method further comprising, after the first sequence, a second sequence comprising:
a second etching of the first portion of the waveguide in such a way as to define a second pattern,
a second smoothing of etching flanks of said second pattern, and
a second epitaxy of the first material on this second pattern, over an epitaxial thickness less than 5 nm, said second sequence making it possible to form a second portion of the waveguide.

6. The method according to claim 1, further comprising, after the at least one sequence, a formation of a third layer based on a third material on the first material, said third material having a refractive index less than that of the first material and greater than that of the second material.

7. The method according to claim 6, wherein the third layer has a thickness comprised between 20 nm and 30 nm.

8. The method according to claim 6, wherein the third material is a nitride based on the first material.

9. The method according to claim 6, wherein said formation of the third layer comprises a conformal deposition of the third material.

10. The method according to claim 9, wherein the conformal deposition of the third material comprises a low pressure chemical vapor deposition (LPCVD).

11. The method according to claim 6, wherein said formation of the third layer comprises a diffusion of species in the first material from a controlled atmosphere.

12. The method according to claim 11, wherein the third material is a nitride based on the first material and the diffusion of species in the first material is a diffusion of nitrogen from a controlled atmosphere having a concentration in nitrogen greater than 80%.

13. The method according to claim 6, further comprising an encapsulation by an encapsulation layer based on the second material on the first material or on the third material.

14. The method according to claim 1, wherein the first material is silicon, the second material is silicon oxide.

15. The method according to claim 11, wherein the third material is a nitride based on the first material and the diffusion of species in the first material is a diffusion of nitrogen from a controlled atmosphere having a concentration in nitrogen equal to 100%.

* * * * *